US005615242A

United States Patent [19]
Hirota

[11] Patent Number: 5,615,242
[45] Date of Patent: Mar. 25, 1997

[54] CHARGE TRANSFER APPARATUS WITH OUTPUT GATE AND DRIVING METHOD THEREOF

[75] Inventor: Isao Hirota, Kanagawa, Japan

[73] Assignee: Sony Corporation, Tokyo, Japan

[21] Appl. No.: 616,284

[22] Filed: Mar. 15, 1996

[30] Foreign Application Priority Data

Mar. 17, 1995 [JP] Japan .................................. 7-058435

[51] Int. Cl.[6] .......................... G11C 19/28; H01L 29/768
[52] U.S. Cl. ............................................. 377/60; 257/239
[58] Field of Search ................................. 377/60; 257/239

[56] References Cited

U.S. PATENT DOCUMENTS

| | | | |
|---|---|---|---|
| 4,627,083 | 12/1986 | Pelgrom et al. | 377/60 |
| 5,199,053 | 3/1993 | Hirama | 377/60 |
| 5,204,989 | 4/1993 | Yamamoto | 377/60 |
| 5,309,005 | 5/1994 | Nagakawa et al. | 377/60 |

*Primary Examiner*—Gene M. Munson
*Attorney, Agent, or Firm*—Hill, Steadman & Simpson

[57] ABSTRACT

A charge transfer apparatus which is capable of reliably improving the transfer efficiency of an output gate section while preventing the occurrence of coupling to output waveforms. A two-phase driving-type charge transfer apparatus is constructed as follows. Transfer clock φH2 used for driving the stage one prior to the final stage of a charge transfer section is divided at a predetermined ratio through the use of two resistors. This causes the generation of drive pulse φOG in phase with and of a smaller amplitude than transfer clock φH2. A gate electrode of an output gate section is driven by this drive pulse φOG.

11 Claims, 5 Drawing Sheets

CHARGE TRANSFER APPARATUS WITH OUTPUT GATE AND DRIVING METHOD THEREOF

BACKGROUND OF THE INVENTION

1. Field of the Invention

The present invention relates generally to a charge transfer apparatus and a driving method of the apparatus. In particular, the invention relates to a two-phase driving-type charge transfer apparatus suitable for use as horizontal transfer registers of a CCD area sensor, transfer registers of a CCD linear sensor, and transfer registers of a CCD delay device. The invention also relates to a driving method of the above type of charge transfer apparatus.

2. Description of the Related Art

The following driving method is mainly employed in a two-phase driving-type CCD charge transfer apparatus. As shown in FIG. 7, a predetermined DC-bias potential E is applied to a gate electrode 74 of an output gate section 73 through which signal charges are transferred from the final stage ($\phi$H1) of a charge transfer section 71 to a charge detecting section 72. This method is advantageous in that the application of DC bias to the gate electrode 74 of the output gate section 73 reduces the level of "coupling" caused by clock driving. "Coupling" refers to fluctuations of a waveform due to capacitive coupling caused by a parasitic capacitor between the gate electrode 74 of the output gate section 73 and the floating region of the charge detecting section 72.

The charge transfers apparatus of the above type of which DC bias is applied to the gate electrode 74 of the output gate section 73, on one hand, has the advantage of reducing the level of coupling to the output waveform, but on the other hand, presents the following problem. The potential of the output gate section 73 is fixed. This decreases, as shown in FIG. 8, the transfer potential difference $A\Delta\phi 1$ between the final stage of the charge transfer section 71 and the output gate section 73 to one half of the amplitude of each of the transfer clocks $\phi$H1 and $\phi$H2 of the charge transfer section 71 or even smaller, the potential difference $\Delta\phi 1$ determining the amount of charge to be handled in the final stage of the charge transfer section 71, thereby easily decreasing the transfer efficiency of the output gate section 73.

For solving this problem, the following type of charge transfer apparatus is known, as disclosed in Japanese Patent Laid-Open No. 6-78220 the apparatus in which the transfer clock for driving the stage one prior to the final stage of the charge transfer section is differentiated, and the resulting differential waveform is applied to the gate electrode of the output gate section. That is, as indicated by the construction of the apparatus shown in FIG. 9, transfer clock $\phi$H2 for driving the stage one prior to the final stage of a charge transfer section 91 is differentiated by a CR differentiating circuit 92, and an output gate section 93 is driven by the resulting differential waveform.

With this construction, the differential waveform is applied to an output electrode 94 while signal charges are transferred from the final stage of the charge transfer section 91 to a charge detecting section 95 via the output gate section 93. This temporarily increases the potential of the output gate section 93, during which the transfer potential difference $A\Delta\phi$ between the final stage of the charge transfer section 91 and the output gate section 93 becomes larger, thus enhancing the transfer efficiency of the output gate section 93.

However, the conventional charge transfer apparatus constructed as described above encounters the following problems. Transfer clock $\phi$H2 is differentiated and then applied to the gate electrode 94 of the output gate section 93. The transfer potential difference $\Delta\phi 1$ can thus be temporarily increased only during this differentiating period, which is insufficient for the transfer period. Additionally, there presents no problem at all if the phases of two-phase transfer clocks $\phi$H1 and $\phi$H2 are completely reversed to each other, as indicated by the solid lines shown in FIG. 10. If transfer clock $\phi$H2 is, however, out of phase as indicated by the broken line shown in FIG. 10, after the differential waveforms has disappeared, transfer clock $\phi$H1 is changed to the "L" level, and transfer clock $\phi$H2 is changed to the "H" level. In this state, the transfer operation of signal charges from the final stage of the charge transfer section 91 to the charge detecting section 95 is started. Thus, the foregoing advantages cannot be obtained.

SUMMARY OF THE INVENTION

Accordingly, in view of this background, it is an object of the present invention to provide a charge transfer apparatus in which the transfer efficiency of an output gate section can be positively improved while the occurrence of coupling to output waveforms is prevented, and also to provide a driving method of the above type of charge transfer apparatus.

In order to achieve the above object, the present invention provides a charge transfer apparatus comprising a charge transfer section for receiving transfer clocks and transferring signal charges; an output gate section located in the vicinity of the final stage of the charge transfer section; a charge detecting section located in the vicinity of the output gate section and detecting the signal charges transferred from the charge transfer section; and means for generating a clock substantially in phase with and of a smaller amplitude than one of the transfer clocks and supplying the generated clock to the output gate section.

The present invention also provides a method for driving a charge transfer apparatus of the type which comprises a charge transfer section, an output gate section located in the vicinity of the charge transfer section, and a charge detecting section located in the vicinity of the output gate section, the method comprising the steps of supplying multi-phase transfer clocks to the charge transfer section; and supplying a clock substantially in phase with and of a smaller amplitude than one of the transfer clocks to the output gate section.

In the charge transfer apparatus discussed above, the transfer clock for driving the stage one prior to the final stage of the charge transfer section is divided through the use of resistors, thereby obtaining a drive pulse in phase with and of a smaller amplitude than the transfer clock. By the application of this drive pulse to the electrode of the output gate section, the potential of the output gate section becomes higher while the signal charge is transferred from the final stage of the charge transfer section to the charge detecting section. This increases the transfer potential difference between the final stage of the charge transfer section and the output gate section, thereby increasing the transfer efficiency of the output gate section.

According to the foregoing driving method, a drive pulse is generated which is in phase with and of a smaller amplitude than the transfer clock for driving the stage one prior to the final stage of the charge transfer section. By the application of this drive pulse to the electrode of the output gate section, the potential of the output gate section becomes higher during the period of transferring signal charges from the final stage of the charge transfer section to the charge detecting section. This increases the transfer potential difference between the final stage of the charge transfer section and the output gate section, thereby enhancing the transfer efficiency of the output gate section.

DESCRIPTION OF THE PREFERRED EMBODIMENTS

A detailed description will now be given of embodiments of the present invention with reference to the drawings.

Figure 1:
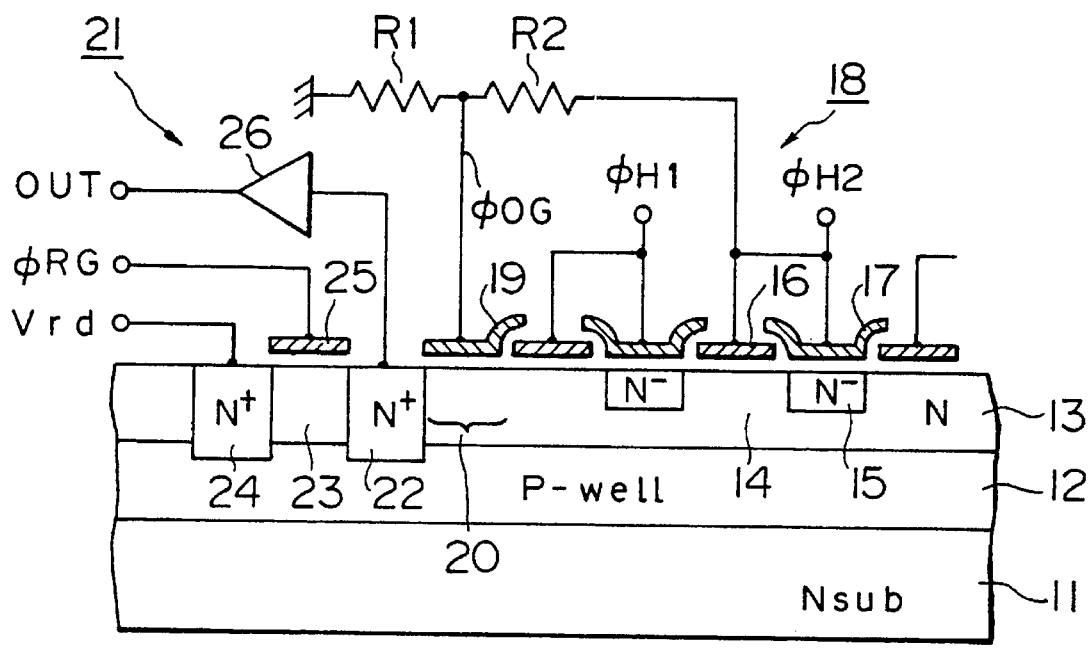
FIG. 1 is a schematic diagram of the construction of an embodiment of a charge transfer apparatus according to the present invention.

FIG. 1 is a schematic diagram of the configuration of an embodiment of a charge transfer apparatus according to the present invention. In FIG. 1, an n-type channel 13 is formed adjacent to the surface of an n-type semiconductor substrate 11 across a p-type well 12. Formed in the surface portion of the n-type channel 13 are n-type transfer (TR) regions 15 at regular pitches from the side to side direction of FIG. 1. A channel region formed between the transfer regions 15 acts as a storage (ST) region 14. Electrodes 16 formed of a first polysilicon layer and electrodes 17 formed of a second polysilicon layer are formed above the storage region 14 and the transfer regions 15, respectively, across an insulating film (not shown). The adjoining electrodes 16 and 17 pair off with each other, and two-phase transfer clocks $\phi H1$ and $\phi H2$ are alternately applied to the pairs of electrodes 16 and 17 in the direction in which the electrodes are arranged. In this manner, a two-phase driving-type charge transfer section 18 is constructed.

In this charge transfer section 18, a gate electrode 19 comprised of the second polysilicon layer is formed adjacent to the final stage of the electrode 16. The gate electrode 19 and the channel region below constitute an output gate section 20 in which each of first and second resistors R1 and R2 is electrically connected at one end to the gate electrode 19. The first resistor R1 is electrically connected at the other end to the ground acting as the reference potential. Also, transfer clock $\phi H2$ for driving the stage one prior to the final stage of the charge transfer section 18 is applied to the other end of the second resistor R2. Accordingly, transfer clock $\phi H2$ is divided at a predetermined ratio through the use of the first and second resistors R1 and R2 and is then applied as drive pulse $\phi OG$ to the gate electrode 19. Namely, the output gate section 20 is driven by drive pulse $\phi OG$ in phase with and of a smaller amplitude than transfer clock $\phi H2$. It should be noted that the dividing ratio of the first and second resistors R1 and R2 is selected as desired according to necessity.

The signal charge transferred by the charge transfer section 18 is output to a charge detecting section 21 via the output gate section 20. The charge detecting section 21 is constructed of, for example, a floating diffusion amplifier comprising an N+-type floating diffusion (FD) region 22 disposed in the vicinity of the output gate section 20, an N+-type reset drain (RD) 24 formed next to the floating diffusion region 22 across a channel region 23, and a reset gate (RG) 25 above the channel region 23 via an insulating film (not shown). In this charge detecting section 21, constant reset voltage Vrd is applied to the reset drain 24, while reset gate pulse $\phi RG$ is applied to the reset gate 25. A signal charge injected into the floating diffusion region 22 is converted to a voltage and discharged to the exterior through a buffer 26.

Figure 2:
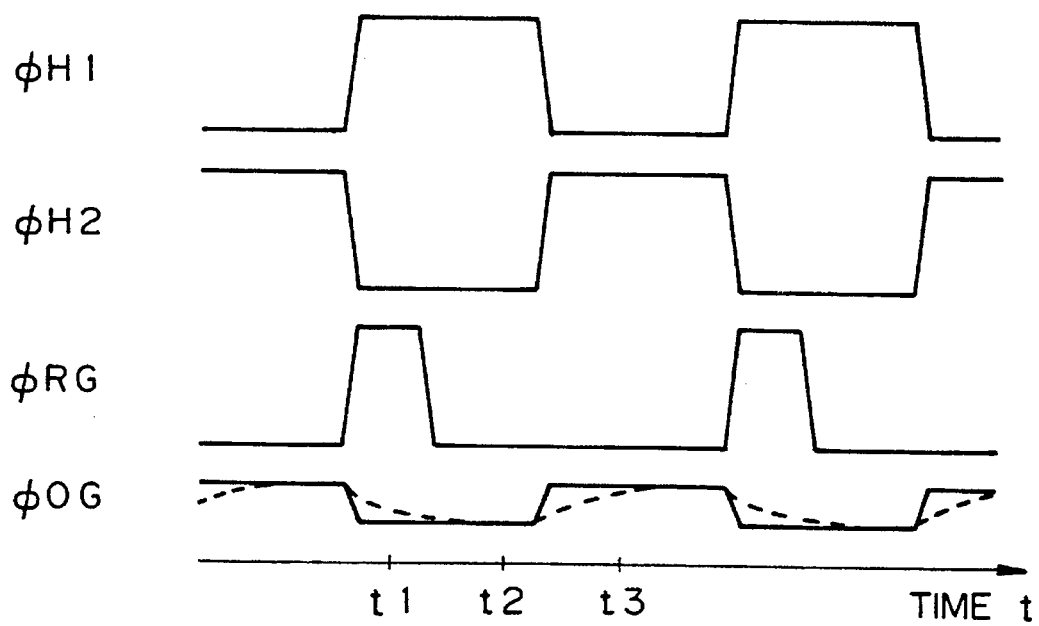
FIG. 2 is a waveform diagram of clock pulses illustrating the operation of the charge transfer apparatus.
Figure 3:
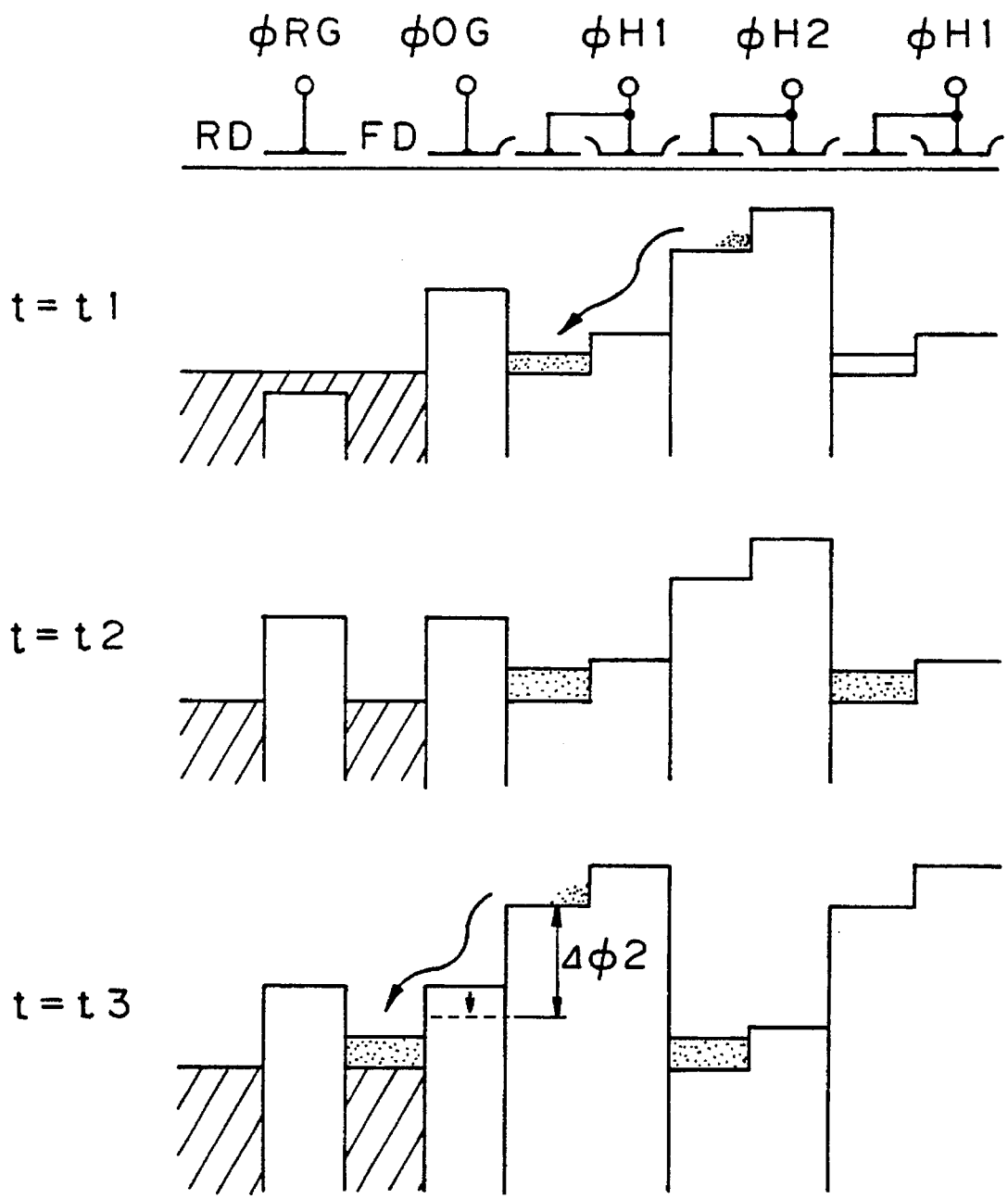
FIG. 3 is a potential diagram illustrating the operation of the charge transfer apparatus.

FIG. 2 illustrates waveforms of two phase transfer clocks $\phi H1$ and $\phi H2$, drive pulse $\phi OG$ applied to the output gate section 20 and reset gate pulse $\phi RG$. The operation performed at time t1 to t3 of this waveform diagram will now be explained with reference to FIG. 3. FIG. 3 illustrates the potential statuses corresponding to time t1 to t3, respectively. At time t1 transfer clock $\phi H1$ is at the "H" level (power supply level), while transfer clock $\phi H2$ is at the "L" level (ground level). In this state, the stage to which clock $\phi H1$ is applied (hereinafter referred to as the $\phi H1$ stage) has a higher potential, while the stage to which clock $\phi H2$ (hereinafter referred to as the $\phi H2$ stage) is applied has a lower potential, and accordingly, the signal charge accumulated in the storage region 14 of the $\phi H2$ stage is transferred to the storage region 14 of the $\phi H1$ stage. At this time, since reset gate pulse $\phi RG$ is also at the "H" level, the potential under the reset gate 25 accordingly becomes higher. The potential of the floating diffusion region 22 is thus reset to potential Vrd of the reset drain 24.

Then, at time t2 transfer clocks $\phi H1$ and $\phi H2$ are in the same state of those at time t1, which does not cause a change in the potentials of the respective $\phi H1$ and $\phi H2$ stages, and the signal charge remains accumulating in the storage region 14 to which transfer pulse $\phi H1$ is applied. At this time, reset gate pulse $\phi RG$ makes a transition from the "H" level to the "L" level so as to cause the potential under the reset gate 25 to change from the higher to the lower state.

At time t3 transfer clock $\phi H1$ is at the "L" level, while transfer clock $\phi H2$ is at the "H" level. In this state, in the charge transfer section 18 the $\phi H1$ stage has a lower potential, while the $\phi H2$ stage has a higher potential, whereby the signal charge accumulated in the storage region 14 of the $\phi H1$ stage is transferred to the floating diffusion region 22 through the output gate section 20. During this transfer period, drive pulse $\phi OG$ is applied to the gate electrode 19 of the output gate section 20. Thus, the potential of the output gate section 20 becomes higher by an amount equivalent to the peak value of drive pulse $\phi OG$, as indicated by the broken line shown in FIG. 3. This increases the transfer potential difference $\Delta\phi2$ between the final stage of the charge transfer section 18 and the output gate section 20.

As discussed above, the output gate section 20 is driven by drive pulse φOG in phase with and of a smaller amplitude than transfer clock φH2. With this arrangement, during the transfer operation in which the signal charge accumulated in the final φH1 stage of the charge transfer section 18 is transferred to the floating diffusion region 22 via the output gate section 20, the transfer potential difference Δφ2 between the final stage of the charge transfer section 18 and the output gate section 20 is increased, thereby improving the transfer efficiency of the output gate section 20.

In particular, drive pulse φOG in phase with and of a smaller amplitude than transfer clock φH2, which is obtained by dividing transfer clock φH2 through the use of resistors, can be generated by a simple construction without requiring phase control. Further, although the clock driving method is employed in which the output gate section 20 is driven in synchronization with transfer pulse φH2, drive pulse φOG has a smaller amplitude than transfer clock φH2, thereby inhibiting coupling to the output waveforms to a minimal level.

Figure 4:
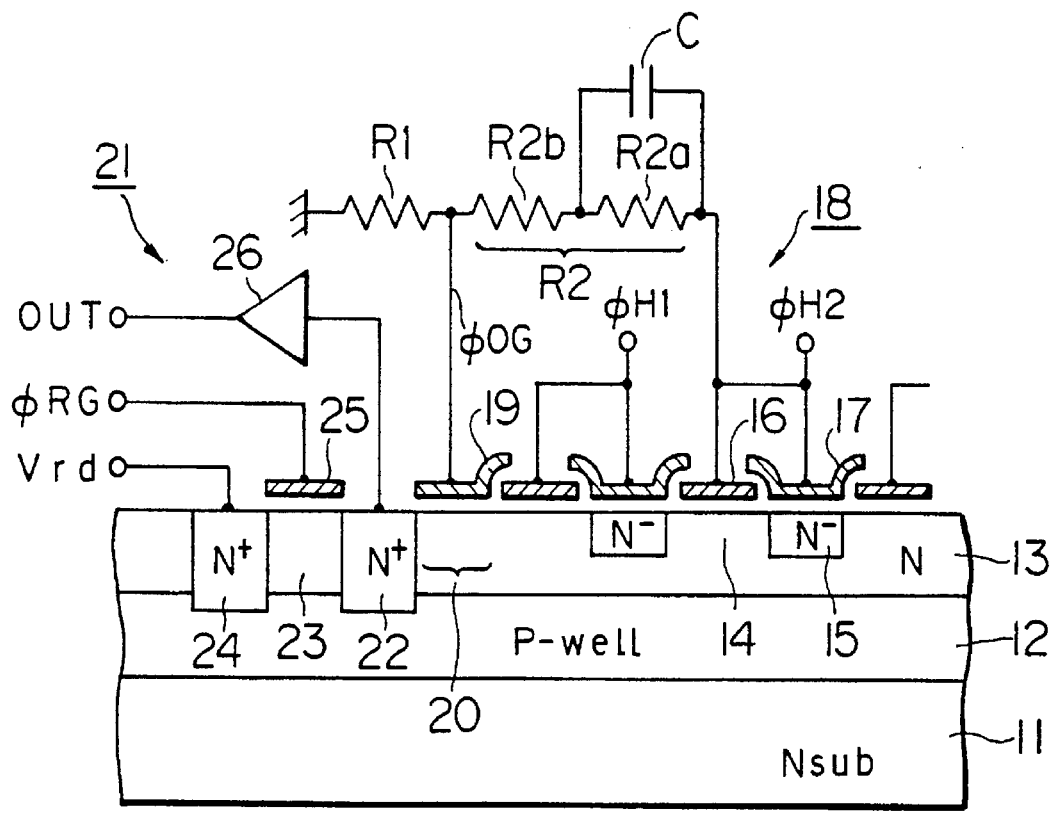
FIG. 4 is a schematic diagram of the construction of another embodiment of a charge transfer apparatus according to the present invention.
Figure 5:
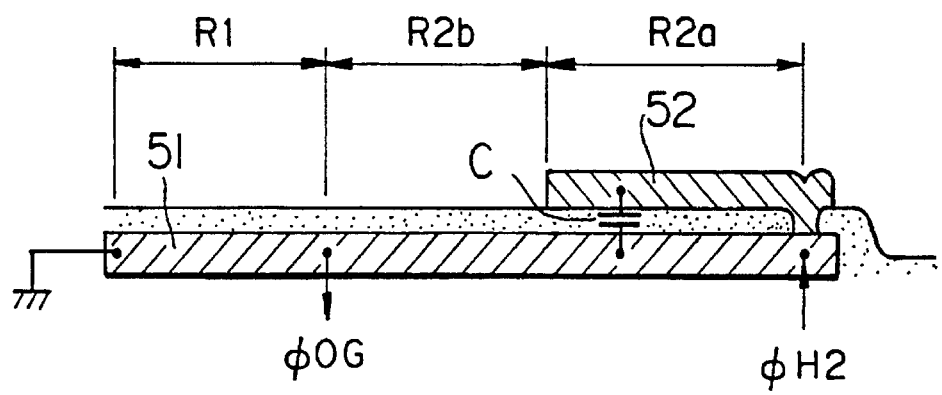
FIG. 5 is a sectional view of the construction of another embodiment.

FIG. 4 is a schematic diagram of the configuration of another embodiment of a charge transfer apparatus according to the present invention. The same elements as those shown in FIG. 1 are designated by like reference numerals. This embodiment is constructed in such a manner that among the first and second resistors R1 and R2 connected to the gate electrode 19, part (R2a) of second resistor R2 is connected in parallel to a speed-up capacitor C. The other elements are similar to those of the construction shown in FIG. 1, and an explanation thereof will thus be omitted. The first and second resistors R1 and R2 can be formed, for example, by patterning a polysilicon (Poly) electrode 51 into the form of an elongated rod, as shown in FIG. 5. On the other hand, the speed-up capacitor C can be formed between the polysilicon electrode 51 and an aluminum (Al) electrode 52 simply by patterning the aluminium electrode 52 on part of the polysilicon electrode 51.

The reason for the addition of the speed-up capacitor C will be given below. The presence of parasitic capacitance in the gate electrode 19 of the output gate section 20 would cause the formation of a CR integrating circuit between the first and second resistors R1 and R2 connected to the gate electrode 19. Then, it would be suspected that the waveform of drive pulse φOG obtained by dividing transfer clock φH2 through the use of resistors may be distorted as indicated by the broken line in FIG. 2. This problem can be solved by setting the respective resistances of the first and second resistors R1 and R2 to smaller values, which then arises the new problem of decreasing the input impedance of the portion to which transfer clock φH2 is applied and increasing the power consumption of the driver for transfer clock φH2.

In contrast, in this embodiment the speed-up capacitor C is connected in parallel to part (R2a) of the second resistor R2. With this construction, transfer clock φH2 is applied via the speed-up capacitor C during the rising and falling periods of transfer clock φH2, whereby the possible distorted waveform of drive pulse φOG caused by the CR integrating circuit can be avoided by a simple construction. Accordingly, drive pulse φOG free from waveform distortion can be obtained as indicated by the solid line shown in FIG. 2. This sufficiently increases the transfer potential difference Δφ2 between the final stage of the charge transfer section 18 and the output gate section 20, thus enhancing the transfer efficiency.

Figure 6:
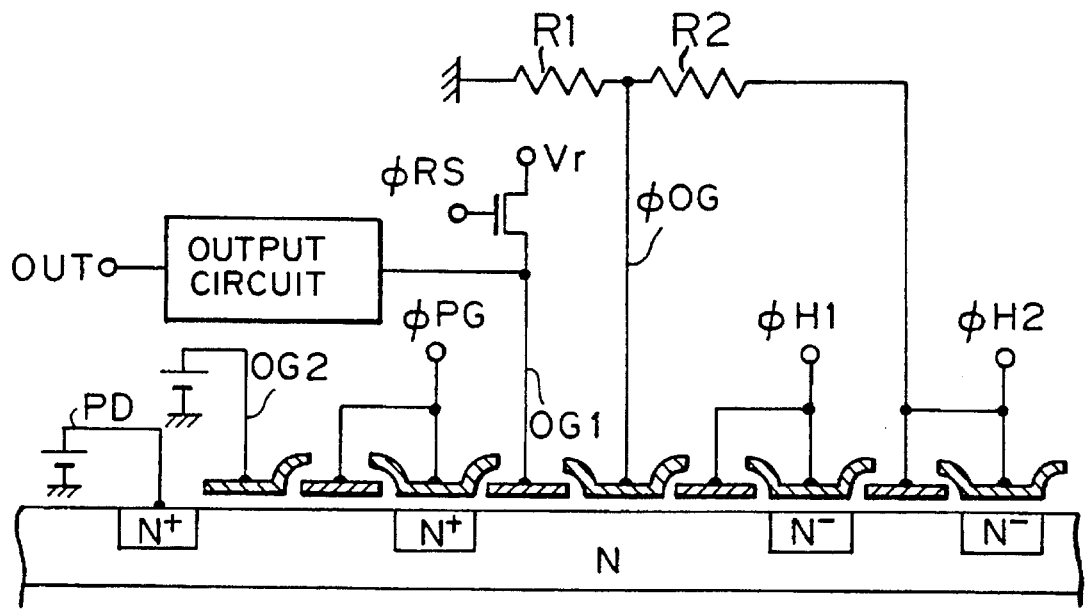
FIG. 6 is a schematic diagram of an example of applications for a floating gate amplifier.
Figure 7:
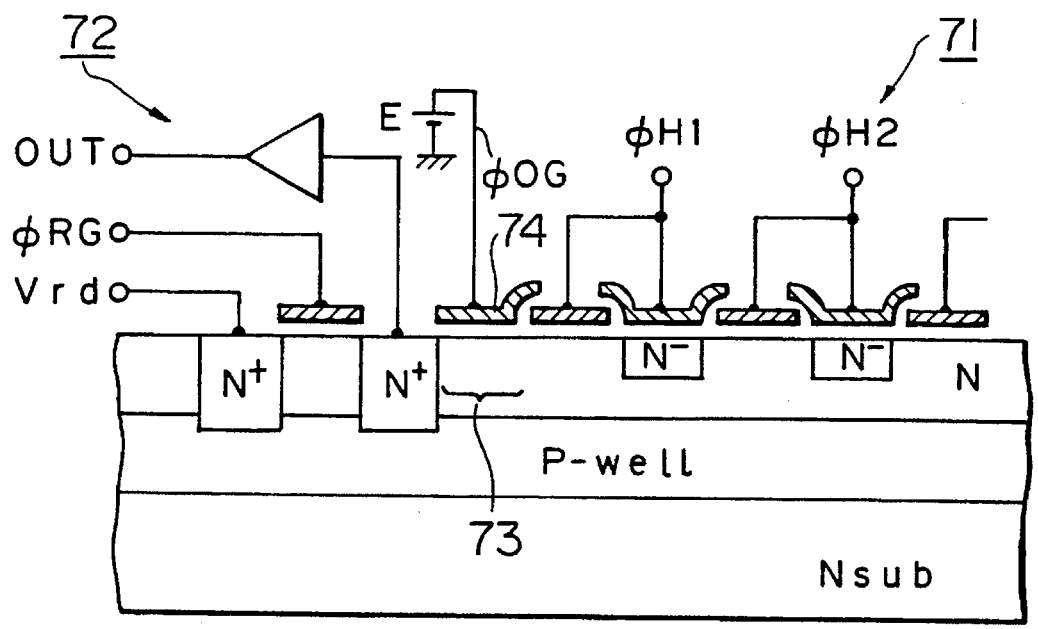
FIG. 7 is a schematic diagram of the construction of an example of conventional charge transfer apparatuses.
Figure 8:
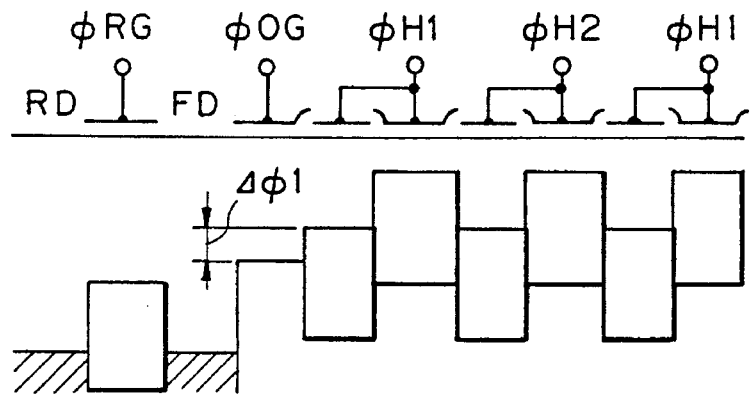
FIG. 8 is a potential diagram of an example of conventional charge transfer apparatuses.
Figure 9:
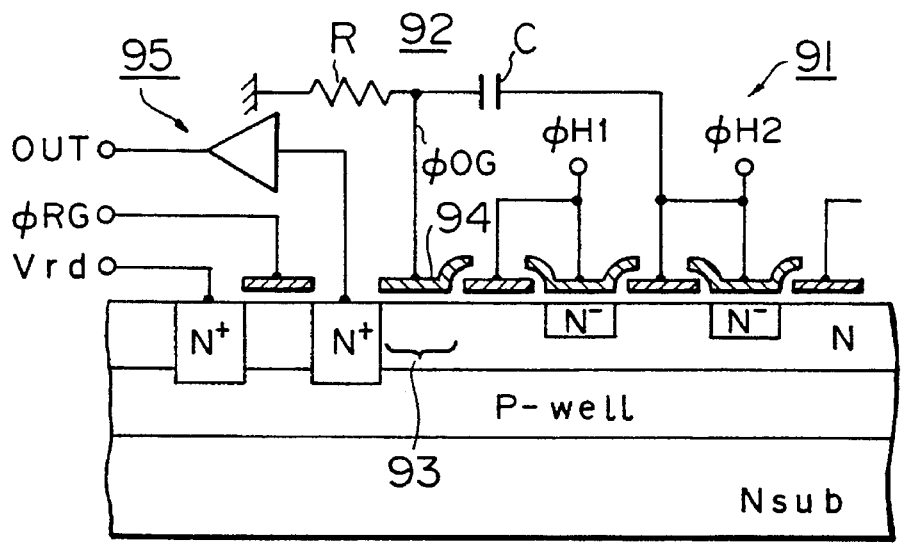
FIG. 9 is a schematic diagram of the construction of another example of conventional charge transfer apparatuses.
Figure 10:
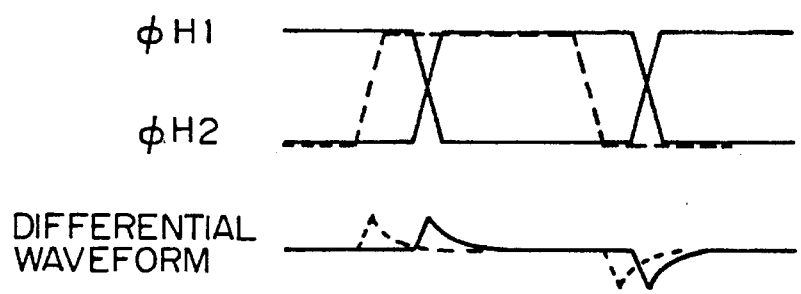
FIG. 10 is a waveform diagram illustrating the problems inherent in the conventional apparatuses.

Although in this embodiment only part (R2a) of the second resistor R2 is connected in parallel to the speed-up capacitor C, it may be wholly connected thereto. Moreover, the capacitance of the speed-up capacitor C and the resistance of the portion (R2a) connected in parallel to the capacitor C may be set as desired according to necessity. Further, the foregoing embodiments have been discussed in such a manner that the charge detecting section 21 is constructed of a floating diffusion amplifier. However, this is not exclusive; for example, the charge detecting section 21 may be applied to a floating gate amplifier, as illustrated in FIG. 6. In this case, however, the two output gate sections 20, i.e., OG1 and OG2, are present. Among these, the output gate section OG1 should be driven by drive pulse φOG that is obtained by dividing through resistors (R1, R2) transfer clock φH2 for driving the stage one prior to the final stage of the charge transfer section. Additionally, although the two-phase driving-type charge transfer section has been employed in the foregoing embodiments, the present invention is applicable to a charge transfer apparatus driven by a multi-phase driving method.

As will be clearly understood from the foregoing description, the present invention offers the following advantages.

The output gate section is driven by a drive pulse in phase with and of a smaller amplitude than the transfer clock used for driving the stage one prior to the final stage of the charge transfer section. With this arrangement, the transfer potential difference between the final stage of the charge transfer section and the output gate section can be made larger while the signal charge accumulated in the final stage of the charge transfer section is transferred to the charge detecting section via the output gate section. This improves the transfer efficiency of the output gate section and also minimizes the level of coupling to the output waveform by virtue of a smaller amplitude of the drive pulse. These advantages can be presented particularly in response to a trend toward smaller amplitudes of the transfer clocks along with lower power voltages of chips. In other words, the present invention can contribute to a decrease in power voltage of chips.

Also, the transfer clock for driving the stage one prior to the final stage of the charge transfer section is divided through the use of resistors so as to obtain a drive pulse for the output gate section. It is thus possible to generate a drive pulse in phase with and of a smaller amplitude than the transfer clock without requiring an additional external terminal or phase control. This easily implements a circuit for producing the drive pulse to be applied to the output gate section. The charge transfer apparatus of the present invention is applicable to horizontal transfer registers for use in a CCD area sensor, transfer registers employed in a CCD linear sensor, and transfer registers for use in a CCD delay device.

What is claimed is:

1. A charge transfer apparatus comprising:

a charge transfer section for receiving transfer clocks and transferring signal charges;

an output gate section located in the vicinity of the final stage of said charge transfer section;

a charge detecting section located in the vicinity of said output gate section and detecting the signal charges transferred from said charge transfer section; and means for generating a clock substantially in phase with and of a smaller amplitude than one of said transfer clocks and supplying the generated clock to said output gate section.

2. A charge transfer apparatus according to claim 1, wherein said means comprises a first resistor connected at one end to a reference potential and at the other end to said output gate section, and a second resistor receiving one of said transfer clocks at one end and being connected to said output gate section at the other end.

3. A charge transfer apparatus according to claim 1, wherein said transfer clocks are comprised of two phases.

4. A charge transfer apparatus according to claim 1, wherein the clock having a smaller amplitude supplied to said output gate section is out of phase with the transfer clock supplied to the final stage of said charge transfer section.

5. A charge transfer apparatus according to claim 1, wherein said charge detecting section is a floating diffusion amplifier.

6. A charge transfer apparatus according to claim 1, wherein said charge detecting section is a floating gate amplifier.

7. A charge transfer apparatus according to claim 2, wherein a capacitor is connected in parallel to at least part of said second resistor.

8. A charge transfer apparatus comprising a charge transfer section for receiving two-phase transfer clocks and transferring signal charges;

an output gate section located in the vicinity of the final stage of said charge transfer section;

a charge detecting section located in the vicinity of said output gate section and detecting the signal charges transferred from said charge transfer section;

a first resistor connected at one end to a reference potential and at the other end to said output gate section; and a second resistor receiving one of said transfer clocks, which drives a stage one prior to the final stage of said charge transfer section, at one end and being connected to said output gate section at the other end.

9. A charge transfer apparatus according to claim 8, wherein a capacitor is connected in parallel to at least part of said second resistor.

10. A method for driving a charge transfer apparatus of the type which comprises a charge transfer section, an output gate section located in the vicinity of said charge transfer section, and a charge detecting section located in the vicinity of said output gate section, said method comprising the steps of:

supplying multi-phase transfer clocks to said charge transfer section; and supplying a clock substantially in phase with and of a smaller amplitude than one of said transfer clocks to said output gate section.

11. A method for driving a charge transfer apparatus according to claim 10, wherein the clock having a smaller amplitude supplied to said output gate section is out of phase with the transfer clock supplied to the final stage of said charge transfer section adjacent to said output gate section.

* * * * *